(12) United States Patent
Yap

(10) Patent No.: US 9,472,528 B2
(45) Date of Patent: Oct. 18, 2016

(54) INTEGRATED ELECTRONIC PACKAGE AND METHOD OF FABRICATION

(71) Applicant: FREESCALE SEMICONDUCTOR, INC., Austin, TX (US)

(72) Inventor: Weng F. Yap, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/296,835

(22) Filed: Jun. 5, 2014

(65) Prior Publication Data

US 2015/0357270 A1 Dec. 10, 2015

(51) Int. Cl.
*H01L 23/48* (2006.01)
*H01L 23/495* (2006.01)
*H01L 23/00* (2006.01)
H01L 21/56 (2006.01)
H01L 23/31 (2006.01)

(52) U.S. Cl.
CPC ............. *H01L 24/49* (2013.01); *H01L 21/568* (2013.01); *H01L 23/3128* (2013.01); *H01L 24/13* (2013.01); *H01L 24/16* (2013.01); *H01L 24/32* (2013.01); *H01L 24/48* (2013.01); *H01L 24/73* (2013.01); *H01L 24/81* (2013.01); *H01L 24/83* (2013.01); *H01L 24/85* (2013.01); *H01L 2224/0401* (2013.01); *H01L 2224/04042* (2013.01); *H01L 2224/131* (2013.01); *H01L 2224/16225* (2013.01); *H01L 2224/32145* (2013.01); *H01L 2224/32245* (2013.01); *H01L 2224/48091* (2013.01); *H01L 2224/48195* (2013.01); *H01L 2224/48247* (2013.01); *H01L 2224/49175* (2013.01); *H01L 2224/73253* (2013.01); *H01L 2224/73265* (2013.01); *H01L 2224/81815* (2013.01); *H01L 2224/83005* (2013.01); *H01L 2224/85005* (2013.01); *H01L 2224/85444* (2013.01); *H01L 2224/85447* (2013.01); *H01L 2224/85455* (2013.01); *H01L 2924/15311* (2013.01); *H01L 2924/181* (2013.01); *H01L 2924/18165* (2013.01); *H01L 2924/19041* (2013.01); *H01L 2924/19042* (2013.01); *H01L 2924/19043* (2013.01); *H01L 2924/19105* (2013.01)

(58) Field of Classification Search
None
See application file for complete search history.

(56) References Cited

U.S. PATENT DOCUMENTS

| 5,075,759 A * | 12/1991 | Moline .......................... 257/692 |
| 6,451,627 B1 * | 9/2002 | Coffman ............. H01L 21/4832 257/E23.054 |
| 6,700,188 B2 * | 3/2004 | Lin ............................... 257/684 |
| 7,109,572 B2 | 9/2006 | Fee et al. |
| 8,076,184 B1 | 12/2011 | Camacho et al. |
| 2011/0033977 A1 | 2/2011 | Huening |
| 2012/0049298 A1 * | 3/2012 | Schlarmann et al. ........ 257/415 |
| 2013/0056862 A1 * | 3/2013 | Kim .................... H01L 25/0657 257/692 |
| 2013/0113091 A1 | 5/2013 | Meng et al. |
| 2014/0008811 A1 | 1/2014 | Yap et al. |

* cited by examiner

*Primary Examiner* — Kimberly Rizkallah
*Assistant Examiner* — Bo Bin Jang
(74) *Attorney, Agent, or Firm* — Charlene R. Jacobsen

(57) ABSTRACT

An integrated electronic package includes an integrated circuit (IC) die and conductive discrete components. Electrical interconnects are formed directly between bond pads on an active side of the IC die and contacts on the conductive discrete components without an intervening lead frame. The IC die, conductive discrete components and electrical interconnects are embedded in an encapsulation material. Contact surfaces of at least some of the conductive discrete components are exposed from the encapsulation material and can be attached to a printed circuit board in order to mount the integrated electronic package to the printed circuit board.

10 Claims, 4 Drawing Sheets

INTEGRATED ELECTRONIC PACKAGE AND METHOD OF FABRICATION

TECHNICAL FIELD OF THE INVENTION

The present invention relates generally to integrated circuit device packaging. More specifically, the present invention relates to a quad flat no lead package and fabrication methodology.

BACKGROUND OF THE INVENTION

A quad flat no lead (QFN) package typically includes an integrated circuit (IC) die attached and electrically connected to a lead frame with one or more rows of lead terminals. The IC die, the electrical connections and a portion of the lead frame are encapsulated by a mold compound, leaving a portion of the leads exposed. The exposed leads serve as input and output (IO) connections to the encapsulated IC die and are typically located along a periphery of the QFN package. QFN packages are widely used because they can provide a number of advantages over other lead frame package configurations including, for example, shorter electrical paths and faster signal communication rates.

Increasingly, device manufacturers are moving toward system-in-package (SiP) solutions. An SiP includes a number of integrated circuits enclosed in a single module (i.e., a package) that can perform all or most of the functions of an electronic system. An SiP may contain one or more IC dies, or chips, plus additional components that are traditionally included on the system motherboard. The IC dies may be stacked vertically or tiled horizontally on a substrate, and they can be internally connected by fine wires that are bonded to the package. Alternatively, with flip chip technology, solder bumps can be used to join the stacked chips together. The additional components within an SiP can include surface mount discrete passive components, integrated passive networks, passive components embedded or patterned in the package substrate, microelectromechanical systems (MEMS) devices, shields, and so forth.

A primary goal of electronic device manufacturing and packaging is to produce smaller integrated electronic packages at lower cost. Smaller integrated electronic packages have a smaller footprint, which is desirable for smaller end products. To that end, continued progress in size reduction of the IC dies and the associated active and passive components also require size reduction of the packaging. But commensurate with the need for smaller footprint and low cost solutions, is the demand for increased functionality and complexity of the IC dies as well as of the active and passive components integrated into the package, along with the same or greater complexity of the electrical connections with external circuits.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Embodiments of the present invention entail integrated electronic packages and methodology for producing the integrated electronic packages. More particularly, the integrated electronic packages implement a quad flat no lead (QFN) system-in-package (SiP) solution in order to include integrated circuit (IC) dies, and associated passive and active electronic components, into a single package in a cost effective manner. The integrated electronic packages discussed below are fabricated without a lead frame to reduce fabrication complexity, while optimizing cost, size, and package performance.

Figure 1:
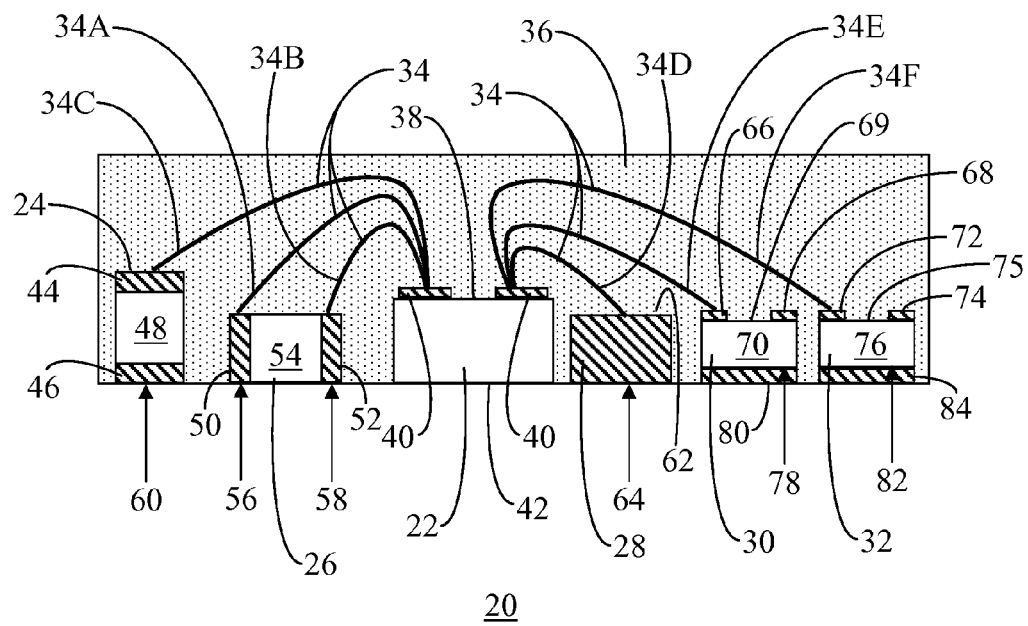
FIG. 1 shows a simplified side view of an integrated electronic package in accordance with an embodiment.
Figure 2:
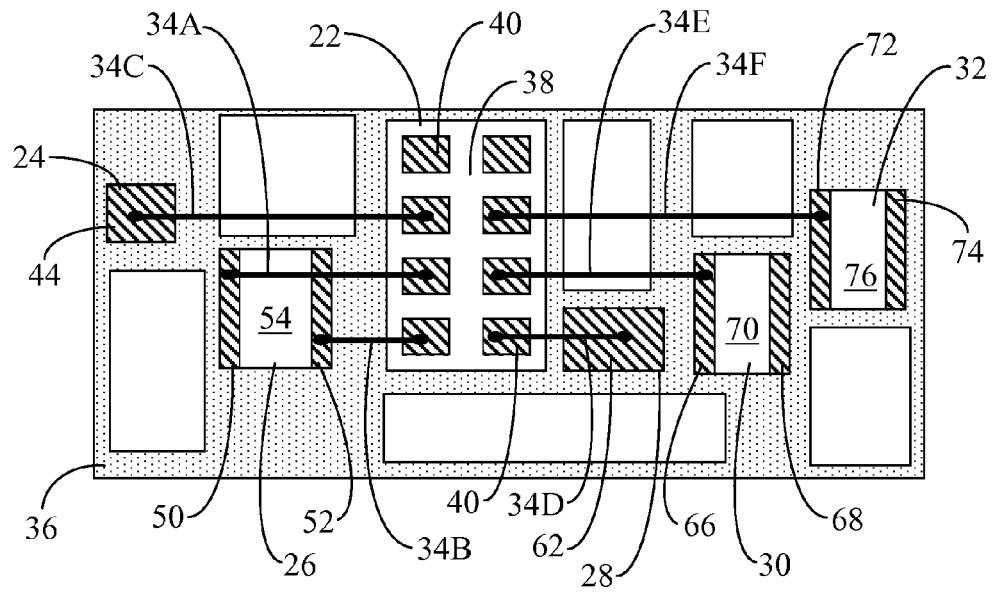
FIG. 2 shows a simplified top view of the integrated electronic package of FIG. 1.

Referring to FIGS. 1-2, FIG. 1 shows a simplified side view of an integrated electronic package 20 in accordance with an embodiment and FIG. 2 shows a simplified top view of integrated electronic package 20. Integrated electronic package 20 includes one or more integrated circuit (IC) dies 22 (only one shown for simplicity) and one or more conductive discrete components 24, 26, 28, 30, 32. Discrete components 24, 26, 28, 30, 32 may include any of a plurality of passive and active components including, for example, surface mount devices, integrated passive networks, microelectromechanical systems (MEMS) devices, shields, and so forth. IC die 22 and discrete components 24, 26, 28, 30, 32 function cooperatively as an electronic system. Thus, integrated electronic package 20 may be considered a system-in-package (SiP) solution.

In accordance with an embodiment, electrical interconnects 34 are suitably formed directly between IC die 22 and discrete components 24, 26, 28, 30, 32 via a wire bonding technique without an intervening lead frame. Thereafter, an encapsulation material 36 is formed over IC die 22, discrete components 24, 26, 28, 30, 32, and electrical interconnects 34. Encapsulation material 36 may be any suitable material (typically referred to as a mold compound) that is used to encapsulate components during device packaging. In the views of integrated electronic package 20 shown in FIGS. 1 and 2, IC die 22, discrete components 24, 26, 28, 30, 32, electrical interconnects 34, and other non-specified components are visible in order to demonstrate their positional relationship to one another. IC die 22, discrete components 24, 26, 28, 30, 32, electrical interconnects 34, and so forth would not actually be visible in an actual integrated electronic package since they would be encapsulated within encapsulation material 36.

An IC package, such as a quad flat no lead (QFN) package, typically includes at least one lead frame. A lead frame provides a central supporting structure for molded IC packages to which all other elements of the molded IC package can be attached. A lead frame is etched or stamped from a thin sheet metal strip to form a pattern of terminals around a central die attach platform upon which the IC die is mounted using, for example, an epoxy resin. The IC die includes bonding pads which are electrically connected to the surrounding lead terminals of the lead frame by fine-diameter conductive wires using well-established wire bond techniques. The assembly including the lead frame, die, and wires are covered with a thermoset plastic casing (e.g., encapsulation material) to complete the molded IC package. The use of lead frames in an integrated electronic package, such as SiP, can increase the design complexity of such a package; result in undesirably high materials, manufacturing, and tooling costs; and result in an undesirably large package footprint. In contrast, the absence of a lead frame in integrated electronic package 20 can reduce design and fabrication complexity, decrease overall size of the package relative to packages that include lead frames, enhance device performance due to a lower quantity of and shorter electrical interconnects between components, optimize package design flexibility, and reduce package cost.

In the side view of FIG. 1, discrete components 24, 26, 28, 30, 32 are arranged in a line with IC die 22 for simplicity of illustration. In the top view of FIG. 2, discrete components 24, 26, 28, 30, 32 are shown in a staggered arrangement extending outwardly from IC die 22 to correspond with their "visibility" in FIG. 1. However, discrete components 24, 26, 28, 30, 32 can be placed in any optimized configuration since they are not constrained by the location of a lead frame surrounding IC die 20. For example, discrete components 24, 26, 28, 30, 32 may be aligned with one another in a direction that extends inwardly into the paper upon which FIG. 1 is drawn. Therefore, they would not be visible in the side view of FIG. 1. Moreover, integrated electronic package 20 can include any quantity of additional components, as represented by the unlabeled blocks in FIG. 2, since package space is not being consumed by a lead frame.

IC die 22 has an active side 38 at which bond pads 40 are located and a back side 42 opposing active side 38. In some embodiments, back side 42 may be exposed from encapsulation material 36, as will be discussed in connection with a fabrication process presented in FIG. 7. Bond pads 40 of IC die 22 can be suitably interconnected with discrete components 24, 26, 28, 30, 32 via electrical interconnects 34. IC die 22 is shown with only a few bond pads 40 for simplicity of illustration. Those skilled in the art will recognize that IC die 22 can include many more bond pads 40 than presented herein in accordance with a particular design. Additionally, only a few electrical interconnects 34 are also shown for simplicity of illustration. It should be understood that the quantity of electrical interconnects 34 relates directly to the interconnection between a particular IC die 22 and the various discrete components 24, 26, 28, 30, 32. Furthermore, electrical interconnects 34 may additionally be formed via wire bonding between the various discrete components 24, 26, 28, 30, 32 which again are not shown for simplicity.

As mentioned briefly above, conductive discrete components 24, 26, 28, 30, 32 can be any of a variety of components that might typically be attached to a motherboard (i.e., a printed circuit board) in a non-SiP configuration. In this example, conductive discrete components 24, 26 represent surface mount devices such as resistors, capacitors, inductors, diodes, and the like. Conductive discrete component 28 represents a conductive pillar or slug of, for example, copper. Conductive discrete components 30, 32 represent chip-based devices such as chip resistors, chip resistor arrays, chip capacitors, and the like.

Conductive discrete component 24 includes a first contact 44, a second contact 46, and a body portion 48 spanning between contacts 44, 46. Similarly, conductive discrete component 26 includes a first contact 50, a second contact 52, and a body portion 54 spanning between contacts 50, 52. Conductive component 26 represents a conventional orientation of a surface mount device. In contrast, conductive compound 24 represents a non-conventional orientation, and more particularly, an upright orientation of a surface mount device as will be discussed below.

Referring first to conductive component 26, first contact 50 includes a first contact surface 56 that is exposed from encapsulation material 36. Additionally, a first one of electrical interconnects 34, labeled 34A, is formed directly between one of bond pads 40 of IC die 22 and first contact 50. Similarly, second contact 52 has a second contact surface 58 that is exposed from encapsulation material 36. Additionally, a second one of electrical interconnects 34, labeled 34B, is formed directly between another one of bond pads 40 and second contact 52. In accordance with an embodiment, contacts 50, 52 may be directly interconnected with bond pads 40 of IC die 22 via electrical interconnects 34A, 34B embedded within encapsulation material 36. Additionally, contact surfaces 56, 58 of contacts 50, 52 are exposed from encapsulation material 36 and can be used as solder terminals for attaching integrated electronic package 20 to a printed circuit board, as will be discussed below.

Now referring to conductive discrete component 24 (i.e., the other surface mount device), first contact 44 is interconnected with one of bond pads 40 of IC die 22 via one of electrical interconnects 34, labeled 34C. Conductive discrete component 24 is oriented in an upright position with first contact 44 and body portion 48 fully embedded within encapsulation material 36. Second contact 46 is not interconnected with IC die 22, and has a contact surface 60 that is exposed from encapsulation material 36. In this position, only second contact 46 may be used as a solder terminal for attaching IC die 22 to a printed circuit board. When only one of the contacts is to be interconnected with IC die 22, as exemplified by conductive discrete component 24, the upright orientation of such a surface mount device may achieve additional space savings in certain design configurations.

In some instances, a specific routing may not require any resistance, capacitance, inductance, or any change of power between one of bond pads 40 and a solder terminal to a printed circuit board. Accordingly, a conductive pillar or slug of, for example, copper, may be placed as represented by conductive discrete component 28. A first contact 62 (i.e., one end of the copper pillar) of component 28 may be electrically connected with one of bond pads 40 via one of electrical interconnects 34, labeled 34D, and a contact surface 64 (i.e., the opposing end of the copper pillar) may be exposed from encapsulation material 36 to serve as a solder terminal for attaching integrated electronic package 20 to a printed circuit board.

Now referring to components 30 and 32, conductive discrete components 30, 32 represent chip-based devices such as chip resistors, chip resistor arrays, chip capacitors, and the like initially formed as a silicon-based die structure. Components 30, 32 may have one or more electrodes located on their top and/or side surfaces. In this simplified example, component 30 includes electrodes 66, 68 formed on a top surface 69 of a silicon-based body portion 70 of component 30. Similarly, component 32 includes electrodes 72, 74 formed on a top surface 75 of a silicon-based body portion 76. One of electrical interconnects 34, labeled 34E, interconnects electrode 66 with one of bond pads 40. Likewise, another electrical interconnect 34, labeled 34F, interconnects electrode 72 with another one of bond pads 40. Electrodes 66, 68, 72, 74 and electrical interconnects 34E, 34F are shown for simplicity of illustration. It should be understood that various additional electrical interconnects may be formed, or alternative electrical connections may be formed between the chip-based devices represented by components 30, 32 and other elements within integrated electronic package 20.

Pertinent to the present invention, a bottom surface 78 of chip-based conductive discrete component 30 includes a metallization layer 80, and a bottom surface 82 of chip-based conductive discrete component 32 includes a metallization layer 84. Electrodes 66, 68, 72, 74 and body portions 70, 76 of respective components 30, 32 are embedded within encapsulation material 36. However, each of metallization layers 80, 84 is exposed from encapsulation material 36 and can serve as electrodes and as additional solder terminals for attaching integrated electronic package 20 to a printed circuit board, as will be discussed below.

Typically, the terminals of a surface mount device or a chip-based device are formed from a tin solder. Accordingly, in traditional manufacturing environments in which surface mount and/or chip-based devices are included on the system motherboard (i.e., a printed circuit board) in a non-SiP configuration, the tin solder terminals are attached to solder pads on the printed circuit board. Reflow soldering is a common method of attaching surface mount components to a circuit board. Reflow soldering is a process in which a solder paste is used to temporarily attach one or several electrical components to their solder pads on, for example, a printed circuit board. After temporary attachment, the entire assembly is subjected to controlled heat, which melts the solder, permanently connecting the joint. The goal of the reflow process is to melt the solder and heat the adjoining surfaces, without overheating and damaging the electrical components.

In accordance with an embodiment, conductive discrete components 24, 26, 28, 30, and 32 have contacts that are formed from a material that melts at a temperature that is higher than the temperature used to perform a reflow soldering process. For example, contacts 44, 46, 50, 52 and electrodes 66, 68, 72, and 74 are preferably gold or copper contacts that electrical interconnects 34 may be wire bonded to. Gold has a melting point of approximately 1063° C. and copper has a melting point of approximately 1084° C. In contrast, tin has a melting point of approximately 232° C. The temperature used during a solder reflow process depends upon the composition of the solder used but can be as high as 260° C. With copper or gold contacts, the wire bonds between, for example, electrical interconnects 34 and contacts 44, 50, 66, and 72 will not detach and potentially cause an electrical connection failure during an ensuing solder reflow process when integrated electronic package 20 is attached to a printed circuit board. Although copper or gold contacts are mentioned herein, other materials that may be used to form the contacts may be nickel or a solder wettable material, each of which has a melting temperature that is greater than the temperature used to perform the solder reflow process.

Figure 3:
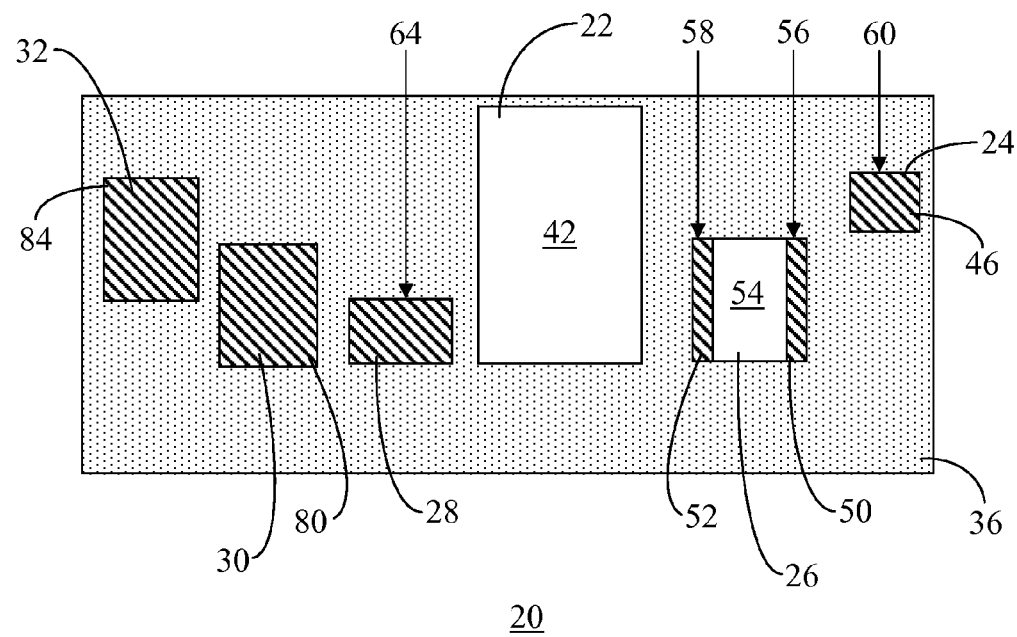
FIG. 3 shows a simplified bottom view of the integrated electronic package of FIG. 1.

FIG. 3 shows a simplified bottom view of integrated electronic package 20. As shown in FIG. 3, contact surface 60 of conductive discrete component 24, contact surfaces 56, 58, of conductive discrete component 26, contact surface 64 of conductive discrete component 28, metallization layer 80 of conductive discrete component 30 and metallization layer 84 of conductive discrete component 32 are exposed from encapsulation material 36 and serve as solder reflow locations for attaching integrated electronic package 20 to a printed circuit board. Back side 42 of IC die 22 and body portion 54 of conductive discrete component 26 may also be exposed from encapsulation material 36. However, these locations need not necessarily serve as solder reflow sites.

Figure 4:
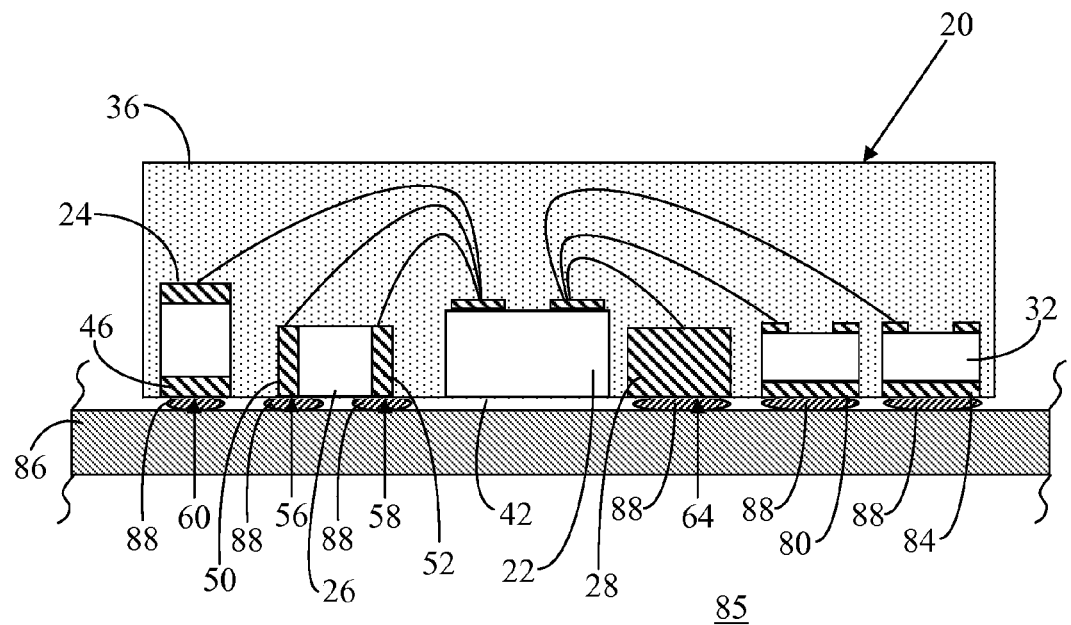
FIG. 4 shows a side view of the integrated electronic package of FIG. 1 attached to a printed circuit board.

FIG. 4 shows a side view of a system 85 that includes integrated electronic package 20 attached to a printed circuit board (PCB) 86. As is widely known to those skilled in the art, PCB 86 is used as a mechanical carrier for electronic components. In addition, PCB 86 can provide the electronic interconnection between the various components on PCB 86 and also between the components and systems external to PCB 86. Only a portion of PCB 86 is shown for simplicity of illustration. Those skilled in the art will recognize that PCB 86 may contain elements that form system 85 other than the quad flat no lead system-in-package device represented by integrated electronic package 20.

During a solder reflow process, solder joins 88 are formed between contact surfaces 60, 56, 58, 64 and PCB 86, as well as between metallization layers 80, 84 and PCB 86. Solder joints 88 form the physical connections between integrated electronic package 20 and PCB 86. Additionally, solder joints 88 can suitably form the electrical pathways between components 24, 26, 28, 30, 32 within integrated electronic package 20 and any components on PCB 86.

Figure 5:
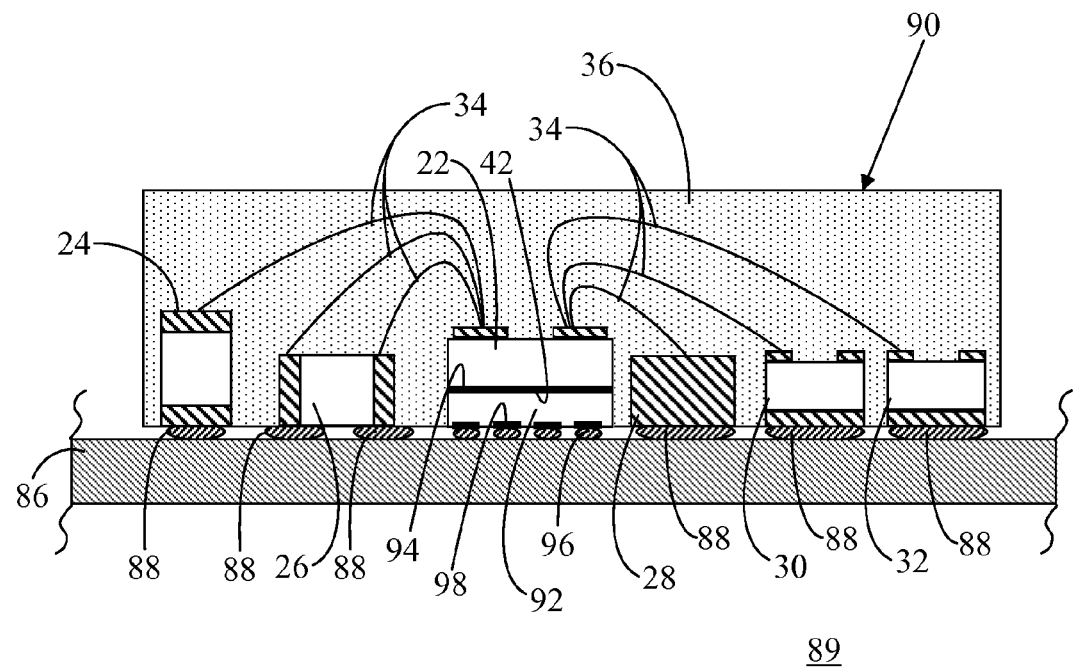
FIG. 5 shows a simplified side view of an integrated electronic package in accordance with another embodiment.

FIG. 5 shows a simplified side view of a system 89 that includes an integrated electronic package 90 in accordance with another embodiment that is attached to PCB 86. Integrated electronic package 90 can include IC die 22, a number of conductive discrete components 24, 26, 28, 30, 32, and electrical interconnects 34 and/or any other suitable IC dies, components, and electrical interconnects as discussed in greater detail above. Integrated electronic package 90 may additionally include a flip chip die 92. In this embodiment, back side 42 of IC die 22 is adhered to an inactive side 94 of flip chip die 92.

Flip chip die 92 is fabricated to include a number of solder bumps 96 deposited onto chip pads 98 of flip chip die 92. During fabrication of integrated electronic package 90, flip chip die 92 is flipped, IC die 22 is adhered to inactive side 94 of flip chip die 92, and the assembly is subsequently encapsulated in encapsulation material 36. During attachment to PCB 86, solder bumps 96 are aligned with matching pads (not shown) on PCB 86, and solder bumps 96 are reflowed to complete the physical and electrical interconnection between flip chip die 92 and PCB 86.

Figure 6:
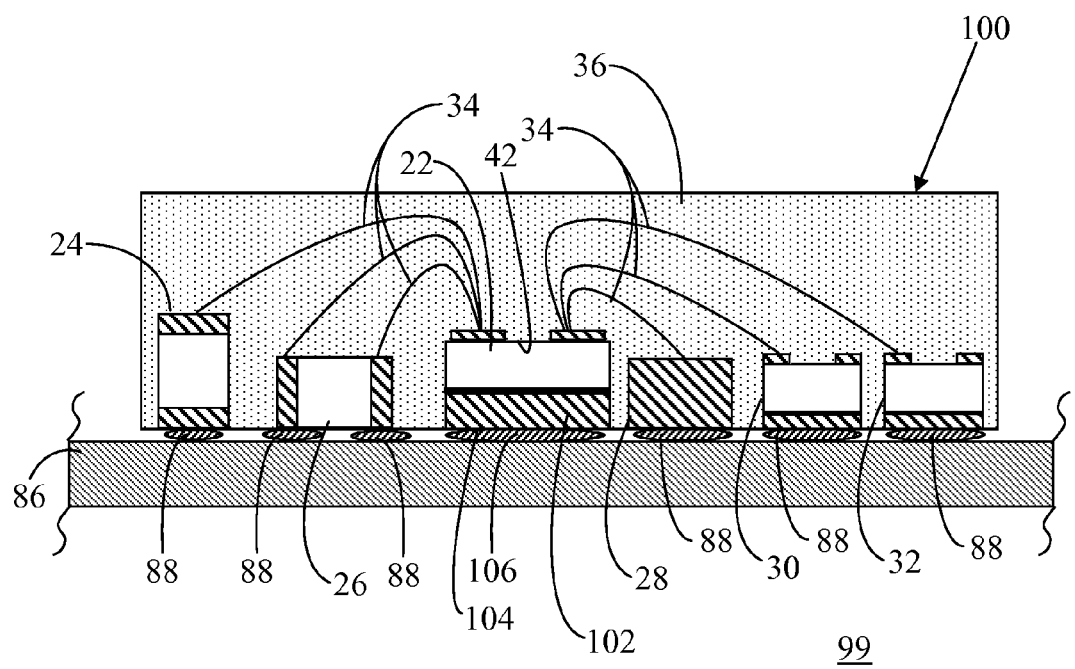
FIG. 6 shows a simplified side view of an integrated electronic package in accordance with another embodiment.

FIG. 6 shows a simplified side view of a system 99 that includes an integrated electronic package 100 in accordance with another embodiment that is attached to PCB 86. Like the previous packages, integrated electronic package 100 can include IC die 22, a number of conductive discrete components 24, 26, 28, 30, 32, and electrical interconnects 34 and/or any other suitable IC dies, components, and electrical interconnects as discussed in greater detail above. Integrated electronic package 100 may additionally include a heat sink 102, such as a copper slug, upon which IC die 22 is mounted. Heat sink 102 functions to conduct heat away from IC die 22. In this configuration back side 42 of IC die 22 is adhered to heat sink 102. A bottom surface 104 of heat sink 102 is exposed from encapsulation material 36. During the reflow process, a solder joint 106 may be formed to complete a physical interconnection between heat sink 102 of integrated electronic package 100 and PCB 86.

Figure 7:
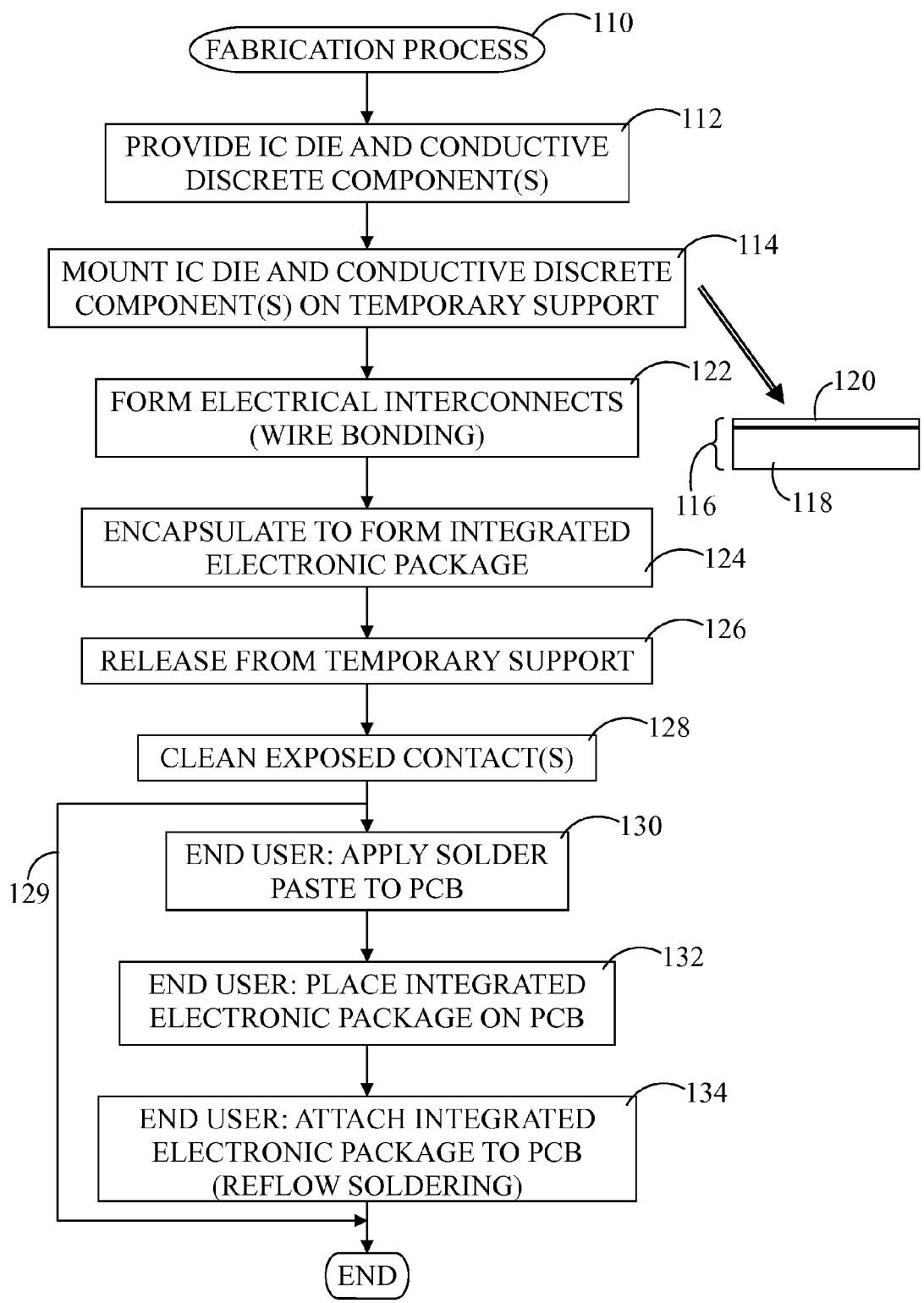
FIG. 7 shows a flowchart of a fabrication process in accordance with another embodiment.

FIG. 7 shows a flowchart of a fabrication process 110 in accordance with another embodiment. Fabrication process 110 can be implemented to fabricate any of integrated electronic packages 20, 90, 100 described in connection with FIG. 106. Of course, fabrication process 110 may be executed to fabricate a plurality of variations of integrated electronic packages, each of which does not include a lead frame and wherein conductive discrete components that might typically be attached to a printed circuit board in a non-SiP configuration are included within the integrated electronic package and form solder terminals for attaching integrated electronic package 20 to the printed circuit board.

Fabrication process 110 includes providing (112) IC die(s) (e.g., IC die 22 as discussed in connection with FIGS. 1-6) and conductive discrete components (e.g., components 24, 26, 28, 30, 32 as discussed in connection with FIGS. 1-6). The IC die(s) and conductive discrete components are mounted (114) on a temporary support 116. Temporary support 116 may include a rigid flat substrate 118, such as glass, ceramic, or any suitable flat material, having a double-sided tape 120 applied to it. For simplicity, temporary support 116 is generally shown in FIG. 7 associated with step 114. Thus, the IC dies(s) and conductive discrete components are stuck to the adhesive surface of double-sided tape 120. Adhesion to tape 120 largely prevents the IC die(s) and other conductive discrete components from moving during subsequent processing in accordance with fabrication process 110.

Electrical interconnects (e.g., electrical interconnects 34 as discussed in connection with FIGS. 1-6) are formed (122) using, for example, a wire bonding technique. The electrical interconnects are formed directly between the bond pads (e.g., bond pads 40) of the IC die(s) and the conductive discrete components without an intervening lead frame. The IC dies(s), conductive discrete components, and the electrical interconnects are encapsulated (124) in a mold compound (e.g. encapsulation material 36 as discussed in connection with FIGS. 1-6) to form an integrated electronic package. The encapsulation material may then be cured. Following encapsulation, the integrated electronic package can be released (126) from temporary support 116 and exposed contact surfaces (e.g., contact surface 56, 58, 60, 64, and metallization layers 80, 84 as discussed in connection with FIGS. 1-6) may be cleaned (128) as needed to remove any tape residue. The resulting integrated electronic packages may be useful as-is and in such an embodiment fabrication process 110 can optionally proceed to END, as exemplified by a path 129.

Alternatively, fabrication process 110 can proceed to a further embodiment to attach integrated electronic package to a printed circuit board by applying (130) solder paste on a printed circuit board (e.g., PCB 86 as discussed in connection with FIGS. 4-6), placing (132) the integrated electronic package on the PCB that contains the solder paste, and attaching (134) the integrated electronic package to the PCB using, for example, a reflow soldering process. This further embodiment may be performed by the manufacturer of the integrated electronic packages. In such a case, the manufacturer of the integrated electronic package may also serve as an end user. Alternatively, the integrated electronic packages may be installed into an application by another manufacturer (i.e., a customer) who serves as the end user. Thereafter, fabrication process 110 proceeds to END.

It is to be understood that certain ones of the process blocks depicted in FIG. 7 may be performed in parallel with each other or with performing other processes. In addition, it is to be understood that the particular ordering of the process blocks depicted in FIG. 7 may be modified, while achieving substantially the same result. Accordingly, such modifications are intended to be included within the scope of the inventive subject matter. In addition, although package configurations are described in conjunction with FIGS. 1-6 above, embodiments may be implemented in packages having other architectures, as well. These and other variations are intended to be included within the scope of the inventive subject matter.

For simplicity and clarity of illustration, the drawing figures illustrate the general manner of construction. Descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention. Furthermore, different elements may be illustrated variously to include hatching or stippling in order to more clearly distinguish the elements from one another.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below," and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

Thus, various embodiments of integrated electronic packages and methodology for producing the integrated electronic packages have been described. More particularly, the integrated electronic packages implement a quad flat no lead (QFN) system-in-package (SiP) solution in order to include integrated circuit (IC) dies, and associated passive and active electronic components, into a single package in a cost effective manner. The integrated electronic packages are fabricated without a lead frame to reduce fabrication complexity, while optimizing cost, size, and package performance. The higher integration capacity of SiP can reduce the number of components in the system can trim the size and routing complexity of the printed circuit board to which it is attached. Additionally, the absence of a lead frame can trim the size and routing complexity of electrical interconnects within the SiP itself.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. An integrated electronic package comprising:
   an integrated circuit (IC) die having an active side at which bond pads are located, and a back side opposing said active side;
   a surface mount component having first and second electrically conductive contacts separated from one another by a body portion spanning between said first and second contacts, wherein said surface mount component comprises at least one of a resistor, a capacitor, an inductor, and a diode;
   a first electrical interconnect formed directly between one of said bond pads and said first contact without an intervening lead frame;
   a second electrical interconnect formed directly between a second one of said bond pads and said second contact; and
   encapsulation material formed over said IC die, said surface mount component, and said electrical interconnect, wherein said first contact and said body portion of said surface mount component are embedded within said encapsulation material and a contact surface of said second contact is exposed from said encapsulation material.

2. The integrated electronic package of claim 1 wherein said contact surface of said second contact is a first contact surface, and said first contact has a second contact surface that is exposed from said encapsulation material.

3. The integrated electronic package of claim 1 further comprising a chip-based device, said chip-based device being one of a chip resistor, a chip resistor array, and a chip capacitor, said chip-based device including:
   a body portion having a third contact located on said body portion; and
   a metallization layer located on a surface of said body portion, wherein said third contact and said body portion are embedded within said encapsulation material, and said metallization layer is exposed from said encapsulation material.

4. The integrated electronic package of claim 1 wherein said first contact is formed from a material that melts at a first temperature, said first temperature being greater than a second temperature used to perform a reflow soldering process.

5. The integrated electronic package of claim 4 wherein said material used to form said first contact is at least one of a gold, a copper, a nickel, and a solder wettable material.

6. An integrated electronic package comprising:
   an integrated circuit (IC) die having an active side at which bond pads are located, and a back side opposing said active side;
   a surface mount component having first and second electrically conductive contacts separated from one another by a body portion spanning between said first and second contacts, wherein said surface mount component comprises at least one of a resistor, a capacitor, an inductor, and a diode, and a material used to form said first and second contacts is at least one of a gold, a copper, a nickel, and a solder wettable material;
   a first electrical interconnect formed directly between one of said bond pads and said first contact without an intervening lead frame;
   a second electrical interconnect formed directly between a second one of said bond pads and said second contact; and
   encapsulation material formed over said IC die, said surface mount component, and said electrical interconnect, wherein said first electrically conductive contact includes a first contact surface that is exposed from said encapsulation material and configured to be attached to a printed circuit board.

7. The integrated electronic package of claim 6 wherein said second electrically conductive contact has a second contact surface that is exposed from said encapsulation material.

8. The integrated electronic package of claim 7 wherein said second contact is formed from said at least one of said gold, said copper, said nickel, and said solder wettable material.

9. The integrated electronic package of claim 6 wherein said second contact is formed from said at least one of said gold, said copper, said nickel, and said solder wettable material.

10. The integrated electronic package of claim 6 further comprising a chip-based device, said chip-based device being one of a chip resistor, a chip resistor array, and a chip capacitor, said chip-based device including;
   a body portion having a third contact located on said body portion; and
   a metallization layer located on a surface of said body portion, wherein said third contact and said body portion are embedded within said encapsulation material, and said metallization layer is exposed from said encapsulation material.

* * * * *